(12) United States Patent
Lee et al.

(10) Patent No.: US 12,117,472 B2
(45) Date of Patent: Oct. 15, 2024

(54) OSCILLATION DETECTOR AND OPERATING METHOD THEREOF

(71) Applicant: SAMSUNG ELECTRONICS CO., LTD., Suwon-si (KR)

(72) Inventors: Jaeseung Lee, Hwaseong-si (KR); Sungmin Yoo, Seoul (KR); Taehwang Kong, Suwon-si (KR); Junhyeok Yang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 153 days.

(21) Appl. No.: 17/873,795

(22) Filed: Jul. 26, 2022

(65) Prior Publication Data

US 2023/0034874 A1    Feb. 2, 2023

(30) Foreign Application Priority Data

Jul. 28, 2021   (KR) .................. 10-2021-0099489

(51) Int. Cl.
  *G01R 23/10*   (2006.01)

(52) U.S. Cl.
  CPC .................... *G01R 23/10* (2013.01)

(58) Field of Classification Search
  CPC ...................................... G01R 24/10
  See application file for complete search history.

(56) References Cited

U.S. PATENT DOCUMENTS

| | | | | |
|---|---|---|---|---|
| 3,970,926 A | * | 7/1976 | Rigby | H04B 3/462 |
| | | | | 324/621 |
| 4,063,169 A | * | 12/1977 | Palmer | G01R 23/10 |
| | | | | 324/76.62 |
| 4,914,600 A | * | 4/1990 | Jankowski | G01R 23/15 |
| | | | | 324/76.47 |
| 7,402,984 B1 | | 7/2008 | Huang | |
| 7,880,554 B2 | | 2/2011 | Raghunathan et al. | |
| 8,487,593 B2 | | 7/2013 | Laur et al. | |
| 8,575,911 B2 | | 11/2013 | Cheng et al. | |
| 9,094,184 B2 | | 7/2015 | Staszewski et al. | |
| 9,425,680 B2 | | 8/2016 | Chen | |
| 10,826,429 B2 | | 11/2020 | Chang et al. | |
| 2010/0295535 A1 | * | 11/2010 | Todorokihara | G01R 23/10 |
| | | | | 324/76.39 |
| 2010/0295536 A1 | * | 11/2010 | Todorokihara | G01R 23/10 |
| | | | | 324/76.39 |
| 2011/0084687 A1 | * | 4/2011 | Todorokihara | G01R 23/10 |
| | | | | 324/76.19 |
| 2020/0343815 A1 | | 10/2020 | Nam | |
| 2021/0389787 A1 | | 12/2021 | Matsumoto et al. | |

FOREIGN PATENT DOCUMENTS

| | | |
|---|---|---|
| JP | 2020-79972 A | 5/2020 |
| KR | 10-2030264 B1 | 10/2019 |

* cited by examiner

*Primary Examiner* — Paresh Patel
(74) *Attorney, Agent, or Firm* — Sughrue Mion, PLLC

(57) ABSTRACT

An oscillation detector includes an amplitude variation detection circuit configured to generate a first pulse signal by comparing levels of voltages with each other, a frequency variation detection circuit configured to generate a second pulse signal by filtering the first pulse signal and allowing to pass a frequency component that is less than or equal to a certain frequency among frequency components of the first pulse signal, and a time variation detection circuit configured to output an oscillation detection signal when the second pulse signal has consecutive pulses for a period of time.

20 Claims, 9 Drawing Sheets

OSCILLATION DETECTOR AND OPERATING METHOD THEREOF

CROSS-REFERENCE TO RELATED APPLICATION

This application is based on and claims priority under 35 U.S.C. § 119 to Korean Patent Application No. 10-2021-0099489, filed on Jul. 28, 2021, in the Korean Intellectual Property Office, the disclosure of which is incorporated by reference herein in its entirety.

BACKGROUND

The inventive concept relates to an oscillation detector and an operating method thereof, and more particularly, to an oscillation detector and a method for detecting whether an output voltage of a circuit oscillates.

Recently, there has been an increasing demand for high-performance circuits. Accordingly, it is important to determine whether a circuit outputs a normal voltage. When an output voltage of a circuit oscillates, the circuit operates abnormally, and therefore, it is important to correctly determine whether the output voltage of the circuit oscillates. However, an oscillation detector that determines whether an output voltage of a circuit oscillates may incorrectly determine output oscillation caused by a high-frequency component, which may be generated during the normal operation of the circuit. As a result, the circuit that operates normally may be problematically shut down.

SUMMARY

The inventive concept provides an oscillation detector capable of correctly detecting a voltage oscillation status by determining whether a voltage oscillates in terms of amplitude, frequency, and/or time and an operating method thereof.

However, the disclosure is not limited to the matters mentioned above, and as such, the inventive concept and variations thereof that has not been mentioned above will be clearly understood by one of skill in the art from the description below.

According to an aspect of the disclosure, there is provided an oscillation detector for detecting oscillation of a voltage, the oscillation detector including: an amplitude variation detection circuit configured to generate a first pulse signal by comparing a level of a first voltage with a level of a second voltage; a frequency variation detection circuit configured to generate a second pulse signal by filtering the first pulse signal and allowing a frequency component that is less than or equal to a reference frequency from among frequency components of the first pulse signal; and a time variation detection circuit configured to output an oscillation detection signal based on the second pulse signal having consecutive pulses for a first time period.

According to another aspect of the disclosure, there is provided an oscillation detector for detecting oscillation of a voltage, the oscillation detector including: an amplitude variation detection circuit configured to generate a first pulse signal by comparing a level of a first voltage with a level of a second voltage; a frequency variation detection circuit configured to count a number of pulses of the first pulse signal in a first time period and generate a second pulse signal based on the number of pulses; and a time variation detection circuit configured to generate a plurality of frequency-divided signals having different frequencies by dividing a frequency of the second pulse signal and output an oscillation detection signal based on the plurality of frequency-divided signals.

According to another aspect of the disclosure, there is provided an operating method of an oscillation detector detecting oscillation of a voltage, the operating method including: outputting a first pulse signal by comparing a level of a first voltage with a level of a second voltage; outputting a second pulse signal by filtering the first pulse signal and allowing a frequency component in the first pulse signal that is less than or equal to a reference frequency among frequency components of the first pulse signal; and outputting an oscillation detection signal based on the second pulse signal having consecutive pulses for a first period of time.

According to another aspect of the disclosure, there is provided an oscillation detector including: a receiver configured to receive an external voltage; and a processor configured to: generate a first voltage by performing low-pass filtering on the external voltage; generate a second voltage by scaling the external voltage; generate a first signal by comparing the first voltage with the second voltage; generate a second signal by filtering the first signal to pass a frequency component that satisfies a first criteria; and output an oscillation detection signal based on the second signal satisfying a second criteria.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments will be described in detail with reference to the accompanying drawings.

Figure 1:
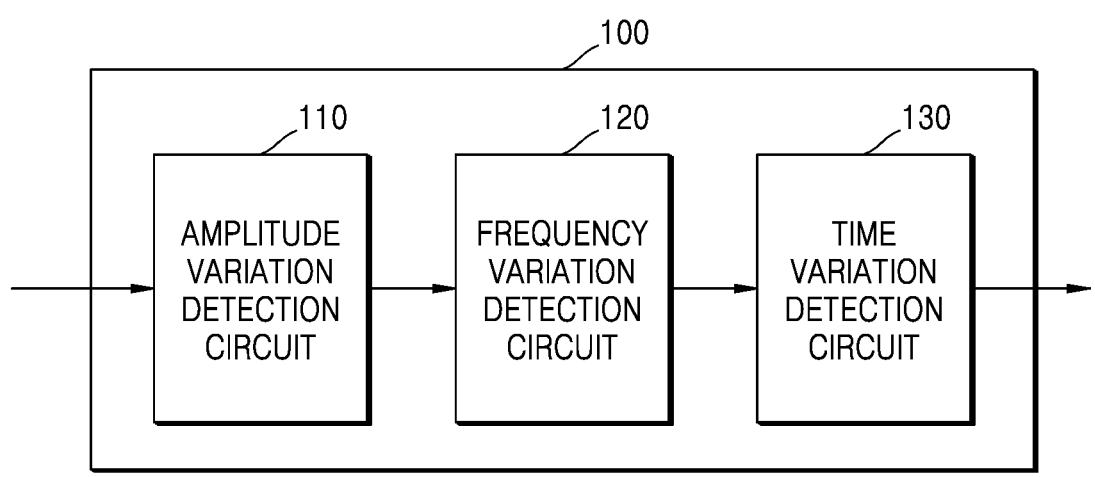
FIG. 1 is a block diagram of an oscillation detector according to an example embodiment.

FIG. 1 is a block diagram of an oscillation detector 100 according to an example embodiment.

Referring to FIG. 1, the oscillation detector 100 may include an amplitude variation detection circuit 110, a frequency variation detection circuit 120, and a time variation detection circuit 130. However, the disclosure is not limited to the arrangement of components illustrated in FIG. 1. For instance, according to another example embodiment, the oscillation detector 100 may include other components or circuits in addition to the amplitude variation detection circuit 110, the frequency variation detection circuit 120, and the time variation detection circuit 130. According to another example embodiment, the oscillation detector 100 may omit one or more of amplitude variation detection circuit 110, the frequency variation detection circuit 120, and the time variation detection circuit 130.

The oscillation detector 100 may receive, as an input voltage, an output voltage of a circuit, such as an oscillator, a low drop-out (LDO), a linear regulator, or a voltage converter, and determine whether the circuit operates normally. For example, the oscillation detector 100 may receive an output voltage of an LDO as an input voltage and determine whether the output voltage of the LDO oscillates. When the oscillation detector 100 determines that the output voltage of the LDO oscillates, the oscillation detector 100 may send an external system a flag indicating that the output voltage of the LDO oscillates.

According to an example embodiment, an output voltage of a circuit, such as an LDO, which is outside the oscillation detector 100, may be referred to as an external voltage, and the oscillation detector 100 may monitor the external voltage. For example, the oscillation detector 100 may monitor the external voltage in terms of subcategories, such as, amplitude, frequency, time, etc. . . . The oscillation detector 100 may correctly detect whether the external voltage oscillates by monitoring the external voltage in terms of the subcategories.

The oscillation detector 100 may be constituted of a digital circuit. Accordingly, the oscillation detector 100 may not require a separate test transistor to test an external voltage. Therefore, compared to a detector requiring a test transistor, the oscillation detector 100, which is constituted of a digital circuit according to an example embodiment, may be more suitable for chip compactness and more efficient in terms of power consumption.

The amplitude variation detection circuit 110 may output a pulse signal based on an input voltage. In detail, the amplitude variation detection circuit 110 may be configured to compare two input voltages with each other and output either logic high or logic low. In other words, the amplitude variation detection circuit 110 may be configured to compare input voltages with each other and output a pulse signal.

The frequency variation detection circuit 120 may allow the oscillation detector 100 to determine that an external voltage oscillates when a receive signal has a component that is greater than or equal to a certain frequency. Accordingly, even though a high-frequency component that may be output from an external circuit operating normally is input to the oscillation detector 100, when the high-frequency component is less than the certain frequency, the oscillation detector 100 may not determine that the external circuit operating normally is abnormal.

The frequency variation detection circuit 120 may be configured to receive a signal from the amplitude variation detection circuit 110. The frequency variation detection circuit 120 may include a frequency counter and count a frequency. Accordingly, the oscillation detector 100 may monitor an external voltage in terms of frequency.

The frequency variation detection circuit 120 may be configured to output a pulse signal based on the frequency of a received signal. For example, when a signal received from the amplitude variation detection circuit 110 is referred to as a first pulse signal, the frequency variation detection circuit 120 may be configured to output a second pulse signal based on the frequency of the first pulse signal. In detail, the frequency variation detection circuit 120 may be configured to generate the second pulse signal by filtering the frequency components of the first pulse signal to allow to pass a frequency component that is less than or equal to a certain frequency. The frequency variation detection circuit 120 will be described in detail below.

The time variation detection circuit 130 may be used to determine that an external circuit outputs an oscillating voltage when a high-frequency component of an output signal of the external circuit is output for at least a certain time. An external voltage corresponding to a high-frequency signal may be output from the external circuit for some period of time even while the external circuit is operating normally. Even though there is a high-frequency component that may be output by the external circuit during a normal operation, the oscillation detector 100 may determine, using the time variation detection circuit 130, that the external circuit is operating normally when the high-frequency component is output for less than the certain time. In detail, the time variation detection circuit 130 may be configured to receive the second pulse signal from the frequency variation detection circuit 120 and output an oscillation detection signal when the second pulse signal has consecutive pulses for at least the certain time. The time variation detection circuit 130 will be described in detail below.

Figure 2:
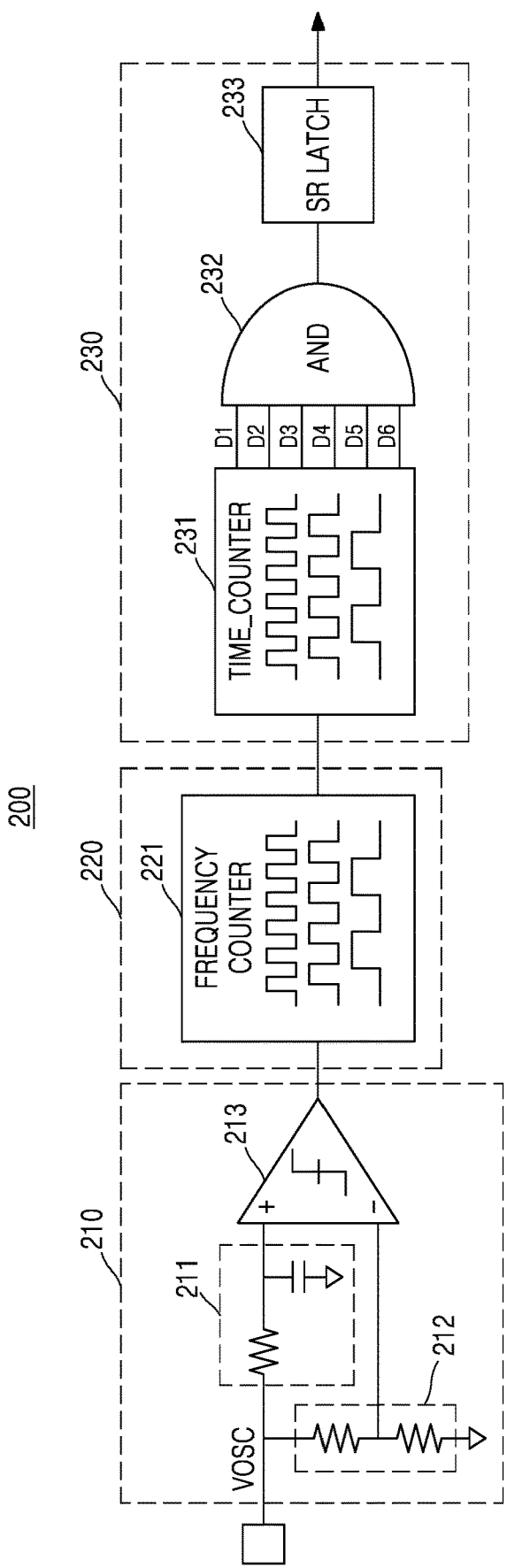
FIG. 2 is a diagram of an oscillation detector according to an example embodiment.

FIG. 2 is a diagram of an oscillation detector 200 according to an example embodiment.

Referring to FIG. 2, the oscillation detector 200 may include an amplitude variation detection circuit 210, a frequency variation detection circuit 220, and/or a time variation detection circuit 230.

Referring to FIGS. 1 and 2, the amplitude variation detection circuit 210, the frequency variation detection circuit 220, and/or the time variation detection circuit 230 may respectively correspond to and be configured to respectively perform the same functions as the amplitude variation detection circuit 110, the frequency variation detection circuit 120, and/or the time variation detection circuit 130.

The amplitude variation detection circuit 210 may include a low-pass filter 211, a plurality of resistors 212, and/or a comparator 213.

The low-pass filter 211 may be configured to perform low-pass filtering on an external voltage VOSC. Although the low-pass filter 211 includes a resistor and a capacitor in FIG. 2, embodiments are not limited thereto. As such, according to another example embodiment, the low-pass filter 211 may include different combination of components to implement a low-pass filter.

The resistors 212 may scale the external voltage VOSC. For example, the external voltage VOSC may be scaled according to a resistance ratio of the resistors 212.

In detail, because the low-pass filter 211 or the resistors 212 are connected to the front end of the comparator 213, the external voltage VOSC that has undergone filtering or scaling may be input as a reference voltage to the comparator 213, instead of a separately provided fixed voltage. When a fixed voltage is input to the comparator 213 as the reference voltage, the oscillation detector 200 may incorrectly determine that an external voltage oscillates even when an external circuit operates normally. For example, an external circuit such as an LDO may momentarily output a voltage at a certain level or higher even during a normal operation. In this case, when a fixed voltage at the certain level or lower is set as the reference voltage of the comparator 213, the external circuit may be determined to operate abnormally. However, when the external voltage VOSC that has undergone filtering or scaling is input to the comparator 213, a voltage varying with the level of the external voltage VOSC may be input to the comparator 213 as the reference voltage, and accordingly, the oscillation of the external voltage VOSC may be adaptively determined compared to when the fixed voltage is input to the comparator 213 as the reference voltage. As a result, the oscillation of the external voltage VOSC may be more accurately determined.

The amplitude variation detection circuit 210 may include the low-pass filter 211 between a first node, to which the external voltage VOSC is applied, and a first input terminal of the comparator 213. The amplitude variation detection circuit 210 may also include a first resistor between the first node and a second node connected to a second input terminal of the comparator 213 and a second resistor between the second node and the ground but is not limited thereto.

The comparator 213 may be connected to the low-pass filter 211 and/or the resistors 212 and configured to generate the first pulse signal by comparing the external voltage VOSC that has undergone low-pass filtering with the external voltage VOSC that has undergone scaling. Alternatively, the comparator 213 may be configured to scale the external voltage VOSC that has undergone low-pass filtering and generate the first pulse signal by comparing a filtered and scaled external voltage with the external voltage VOSC.

The frequency variation detection circuit 220 may include a counter 221. The counter 221 may be frequency counter configured to generate a second pulse signal by filtering a first pulse signal to allow to pass frequency components that are less than or equal to a certain frequency from among the frequency components of the first pulse signal.

The time variation detection circuit 230 may include a time counter 231, an AND gate 232, and/or a memory circuit 233. For example, the memory circuit 233 may correspond to an SR latch but is not limited thereto. As such, according to another example embodiment, other components may be used to implement the memory circuit 233.

The time counter 231 may be configured to divide the frequency of an input signal. For example, the time counter 231 may be configured to generate a plurality of frequency-divided signals having different frequencies by dividing the frequency of the second pulse signal received from the frequency variation detection circuit 220.

The AND gate 232 may be configured to perform an AND operation on the frequency-divided signals.

The memory circuit 233 may be configured to output an oscillation detection signal based on an ANDed signal. The time variation detection circuit 230 will be described in detail below.

Figure 3A:
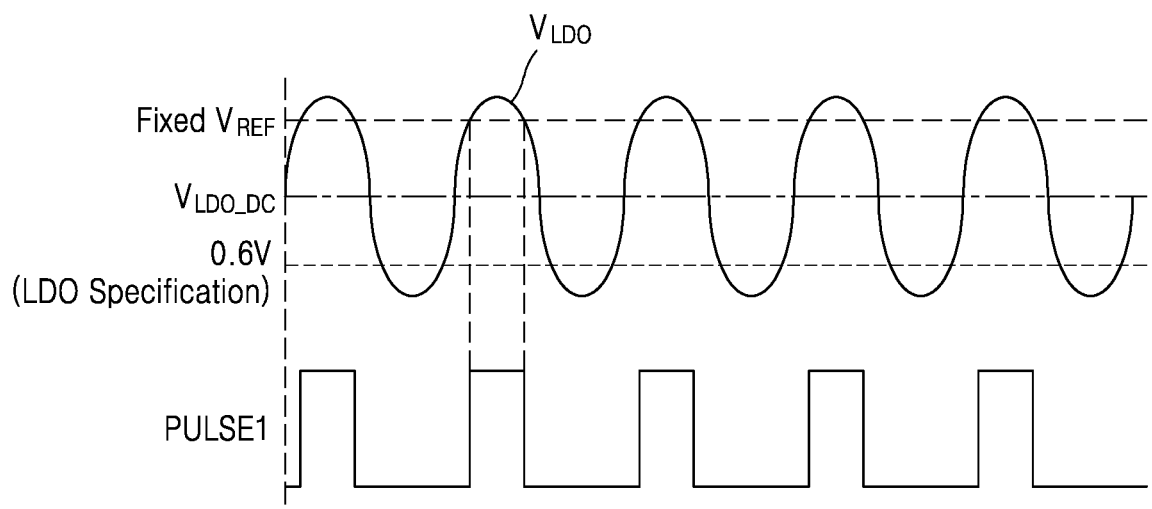
FIGS. 3A and 3B are diagrams to describe the operations of an amplitude variation detection circuit, according to example embodiments.
Figure 3B:
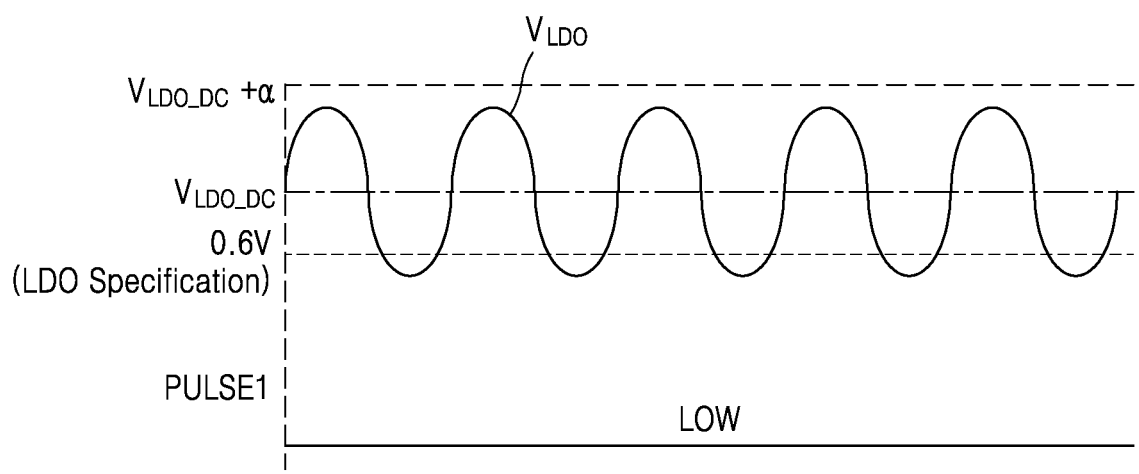

FIGS. 3A and 3B are diagrams to describe the operations of an amplitude variation detection circuit, according to example embodiments.

FIG. 3A shows the graphs of signals when a fixed voltage $V_{REF}$ is input as a reference voltage to the comparator 213 in FIG. 2.

An external voltage $V_{LDO}$ in FIG. 3A may change within a target amplitude. For example, assuming that the external voltage $V_{LDO}$ is an output voltage of an LDO, the external voltage $V_{LDO}$ may change within a range that is 5% of an LDO specification and may be assumed to change within a normal range. Specifically, assuming that the LDO specification is 0.6 V, the external voltage $V_{LDO}$ may change in a range from a value obtained by subtracting 30 mV from the level of a direct current (DC) component $V_{LDO\_DC}$ of the external voltage $V_{LDO}$ to a value obtained by adding 30 mV to the level of the DC component $V_{LDO\_DC}$ of the external voltage $V_{LDO}$. However, when the fixed voltage $V_{REF}$ is applied to the comparator 213 as the reference voltage, there may be a period in which the level of the external voltage $V_{LDO}$ is higher than the level of the fixed voltage $V_{REF}$ according to the level of the DC component $V_{LDO\_DC}$ of the external voltage $V_{LDO}$ even while the external voltage $V_{LDO}$ is changing within the target amplitude, and accordingly, a first pulse signal Pulse1 may be generated. This may cause an external voltage to be incorrectly determined to oscillate even when an external circuit operates normally.

Similarly to FIG. 3A, the external voltage $V_{LDO}$ in FIG. 3B may be assumed to change within the target amplitude.

Referring to FIG. 3B, the amplitude variation detection circuit 210 may be configured to compare the level of a first voltage obtained by scaling an external voltage with the level of a second voltage corresponding to a DC component of the external voltage and output a first pulse signal by generating a pulse signal when the first voltage is greater than the second voltage.

The amplitude variation detection circuit 210 may be configured to compare the level of the external voltage with the level of a voltage obtained by low-pass filtering and scaling the external voltage and output the first pulse signal by generating a pulse signal when the level of the external voltage is greater than the level of the low-pass filtered and scaled voltage.

A filtered or scaled external voltage $V_{LDO\_DC}+\alpha$ output from the low-pass filter 211 or the resistors 212 may vary with the level of the external voltage $V_{LDO}$. Accordingly, when the external voltage $V_{LDO}$ changes within the target amplitude, the comparator 213 may not generate a pulse signal. For example, assuming that a voltage operates normally when the voltage changes within the range that is 5% of the LDO specification as described above, the filtered or scaled external voltage $V_{LDO\_DC}+\alpha$ may have a value obtained by adding a value greater than 5% of the LDO specification to the DC component $V_{LDO\_DC}$ of the external voltage $V_{LDO}$. Accordingly, when the level of the DC component $V_{LDO\_DC}$ of the external voltage $V_{LDO}$ changes, the level of the filtered or scaled external voltage $V_{LDO\_DC}+\alpha$ also changes. When the external voltage $V_{LDO}$ changes within the range of 5% of the LDO specification, the oscillation detector 200 may determine that the LDO operates normally.

Accordingly, when the oscillation detector 200 includes the low-pass filter 211 and/or the resistors 212, the oscillation detector 200 may accurately monitor the external voltage $V_{LDO}$ in terms of amplitude and more adaptively and accurately determine the oscillation of the external voltage $V_{LDO}$ than when the fixed voltage $V_{REF}$ is input as the reference voltage to the comparator 213.

The range of the normal operating voltage of the external circuit, the LDO specification, and the fact that the external circuit is an LDO are just examples for convenience of descriptions, and embodiments are not limited thereto.

Figure 4:
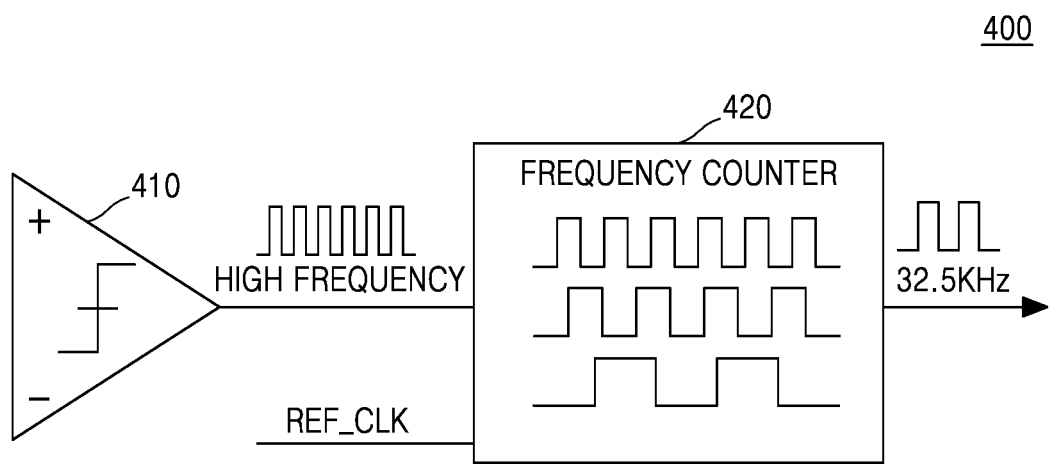
FIG. 4 is a diagram to describe a frequency variation detection circuit, according to an example embodiment.

FIG. 4 is a diagram to describe a frequency variation detection circuit, according to an example embodiment.

Referring to FIG. 4, the frequency variation detection circuit may include a frequency counter 420 and/or a comparator 410. The frequency variation detection circuit may be configured to receive a reference clock signal REF_CLK and may include the frequency counter 420. The frequency counter 420 may be connected to the comparator 410 and configured to receive the reference clock signal REF_CLK.

The frequency counter 420 may be configured to generate a second pulse signal by filtering a first pulse signal to pass frequency components that are less than or equal to a certain frequency from among the frequency components of the first pulse signal.

The frequency counter 420 may be configured to receive the reference clock signal REF_CLK and generate the second pulse signal at a high level when the number of cycles of the first pulse signal that is counted while the reference clock signal REF_CLK is at a high level is greater than or equal to a certain value. This will be described in detail with reference to FIG. 5.

Figure 5:
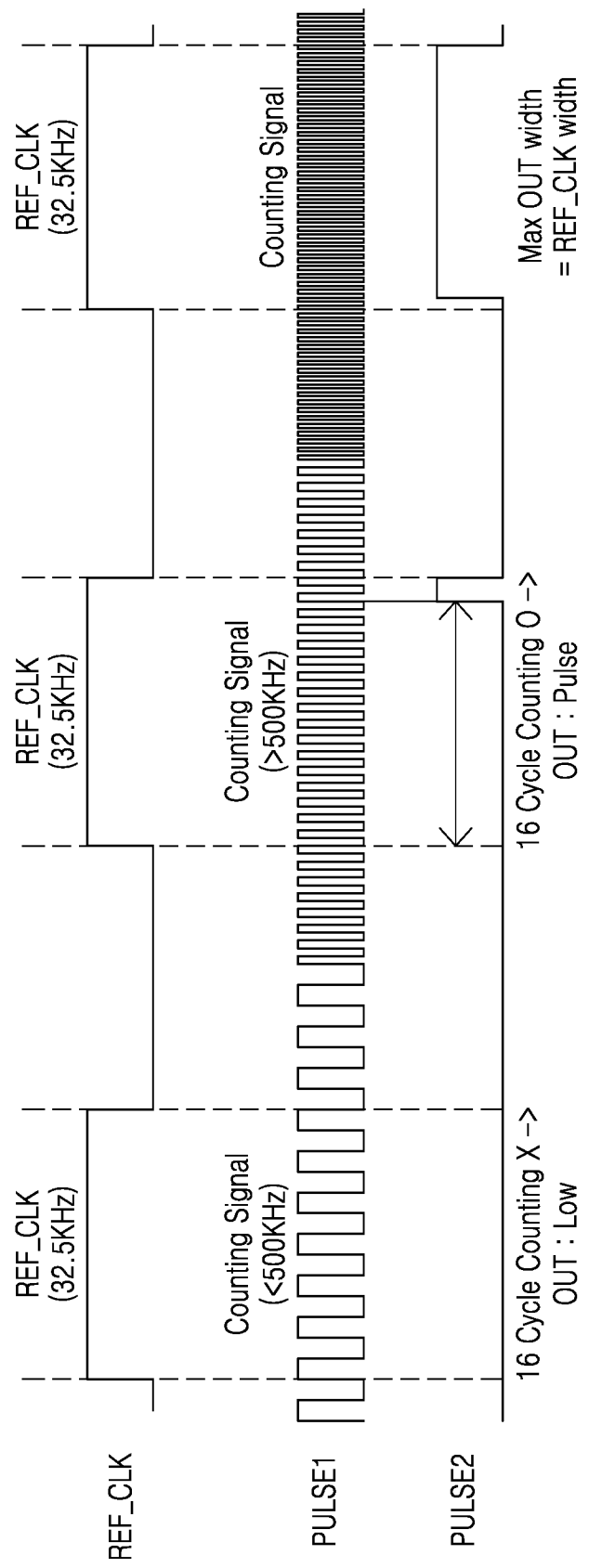
FIG. 5 is a diagram to describe the operation of a frequency variation detection circuit, according to an example embodiment.

FIG. 5 is a diagram to describe the operation of a frequency variation detection circuit, according to an example embodiment.

Referring to FIGS. 2 and 5, the frequency variation detection circuit 220 may be configured to receive the reference clock signal REF_CLK. The frequency of the reference clock signal REF_CLK may be 32.5 KHz but is not limited thereto.

For example, the frequency variation detection circuit 220 may be configured to generate a second pulse signal Pulse2 at a low level when the number of pulses of the first pulse signal Pulse1 is less than a threshold value while the reference clock signal REF_CLK is at the high level.

The frequency variation detection circuit 220 may be configured to generate the second pulse signal Pulse2 at a high level starting from a time when the number of counted pulses of the first pulse signal Pulse1 is at least the threshold value while the reference clock signal REF_CLK is at the high level.

It is assumed that the threshold value is 16 in FIG. 5, but the threshold value is not limited to 16.

For example, the frequency variation detection circuit 220 may be configured to receive the first pulse signal Pulse1 from the amplitude variation detection circuit 210 and count pulses or cycles of the first pulse signal Pulse1.

In detail, the frequency variation detection circuit 220 may be configured to count pulses or cycles of the first pulse signal Pulse1 while the reference clock signal REF_CLK is at the high level. Assuming that the frequency of the reference clock signal REF_CLK is 32.5 KHz and the threshold value is 16, the frequency variation detection circuit 220 may be configured to generate the second pulse signal Pulse2 at the low level when the number of cycles of the first pulse signal Pulse1 is less than 16 while the reference clock signal REF_CLK is at the high level. In other words, the frequency variation detection circuit 220 may be configured to generate the second pulse signal Pulse2 at the low level when the frequency of the first pulse signal Pulse1 is less than 500 KHz.

The frequency variation detection circuit 220 may also be configured to generate the second pulse signal Pulse2 at the high level starting from a time when the number of counted cycles of the first pulse signal Pulse1 is at least 16 while the reference clock signal REF_CLK is at the high level. In other words, the frequency variation detection circuit 220 may be configured to generate the second pulse signal Pulse2 at the high level starting from a time when the frequency of the first pulse signal Pulse1 is determined to be at least 500 KHz.

Accordingly, the frequency of the second pulse signal Pulse2 output from the frequency variation detection circuit 220 may be the same as the frequency of the reference clock signal REF_CLK, and only the duty cycle of the second pulse signal Pulse2 may be different from the duty cycle of the reference clock signal REF_CLK. The pulse width of the second pulse signal Pulse2 may be less than or equal to the pulse width of the reference clock signal REF_CLK.

Due to the operation of the frequency variation detection circuit 220 described above, a frequency component that is less than a certain value (e.g., 500 KHz in FIG. 5) may be transmitted through filtering.

Figure 6:
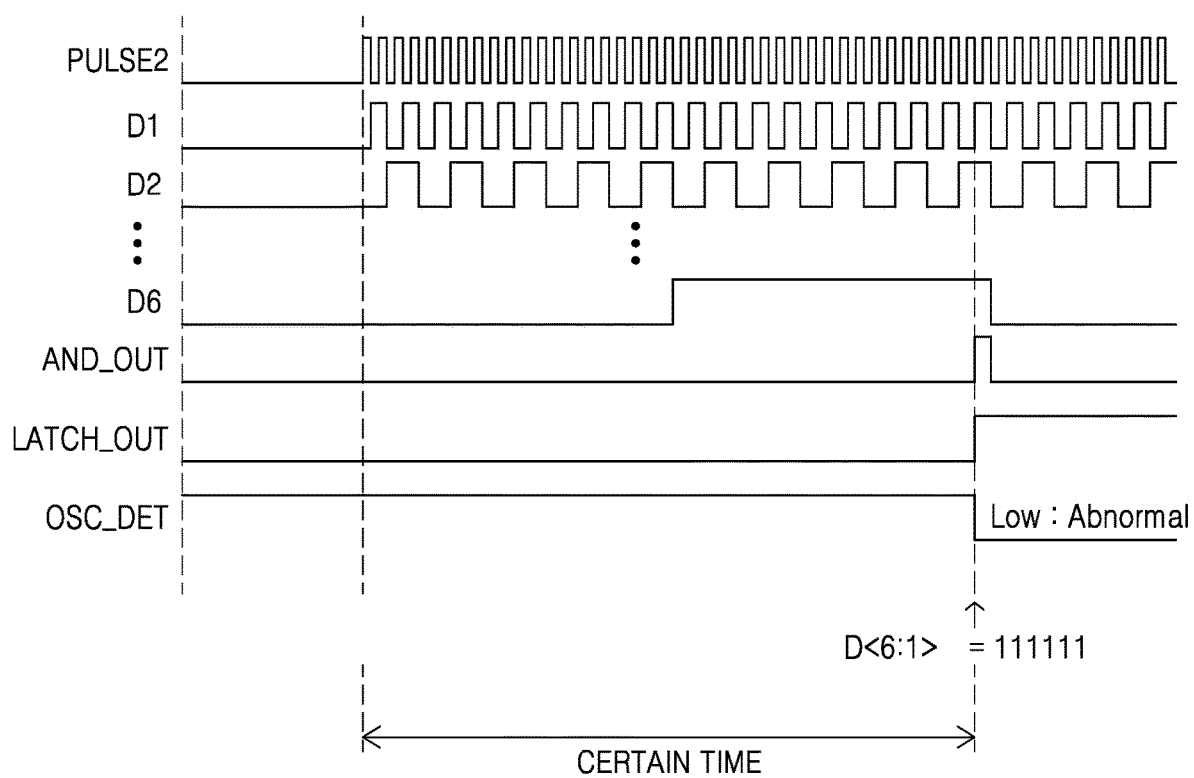
FIG. 6 is a diagram to describe the operation of a time variation detection circuit, according to an example embodiment.

FIG. 6 is a diagram to describe the operation of a time variation detection circuit, according to an example embodiment.

Referring to FIGS. 2 and 6, the time variation detection circuit 230 may be configured to output an oscillation detection signal when the second pulse signal Pulse2 has consecutive pulses for at least a certain time. The time variation detection circuit 230 may be configured to divide the second pulse signal Pulse2 into a plurality of frequency-divided signals (e.g., D1 to D6), which have different frequencies, using the time counter 231. Here, the number of frequency-divided signals may vary with the frequency of a reference clock signal or the like and is assumed to be six for convenience of descriptions.

The frequency-divided signals D1 to D6 may be input to the AND gate 232 and may thus undergo an AND operation. An ANDed signal AND_OUT may have a pulse at a high level when all the frequency-divided signals D1 to D6 have a value of 1 (i.e., D<6:1>=111111). When the ANDed signal AND_OUT is at a low level for a certain time and has a pulse signal after the certain time elapses, the oscillation detector 200 may determine that an external voltage is oscillating for the certain time or longer. Accordingly, when the ANDed signal AND_OUT has a pulse signal after the certain time elapses, the time variation detection circuit 230 may be configured to output an oscillation detection signal. The ANDed signal AND_OUT may have a transient pulse, and a pulse signal may not be continuously at the high level. The time variation detection circuit 230 may maintain the pulse signal, which is generated after the certain time elapses, at the high level using the memory circuit 233. FIG. 6 shows that, after the certain time elapses, an output signal LATCH_OUT of the memory circuit 233 is maintained at the high level by using an SR latch as the memory circuit 233. The time variation detection circuit 230 may be configured to send the output signal LATCH_OUT of the memory circuit 233 to the outside as an oscillation detection signal and may thus inform that an external voltage oscillates. The time variation detection circuit 230 may use as an oscillation detection signal an inverted signal OSC_DET of the output signal LATCH_OUT of the memory circuit 233. When the inverted signal OSC_DET of the output signal LATCH_OUT of the memory circuit 233 is at a low level after the certain time elapses, the external voltage may oscillate.

The time counter 231 may divide the second pulse signal Pulse2 by a plurality of division factors. The division factors may be determined based on the frequency of the reference clock signal.

By including the time variation detection circuit 230, the oscillation detector 200 may determine that the external voltage does not oscillate with respect to a high-frequency component signal that is maintained for the certain time or less, and thus monitor the external voltage in terms of time.

Figure 7:
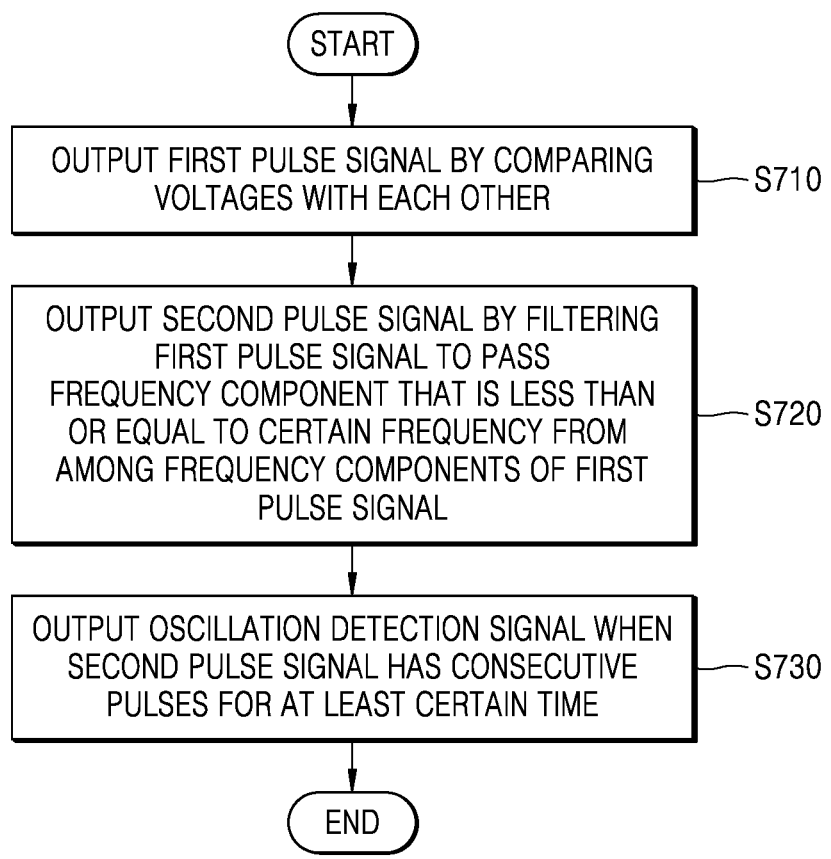
FIG. 7 is a flowchart of an operating method of an oscillation detector, according to an example embodiment.

FIG. 7 is a flowchart of an operating method of an oscillation detector, according to an example embodiment.

Referring to FIG. 7, the operating method of the oscillation detector may include outputting a first pulse signal by comparing voltages with each other in operation S710.

The operating method of the oscillation detector may include outputting a second pulse signal by filtering the first pulse signal to allow to pass a frequency component that is less than or equal to a certain frequency from among the frequency components of the first pulse signal in operation S720. In detail, the oscillation detector may receive a reference clock signal and output the second pulse signal that has the same frequency as the reference clock signal.

The operating method of the oscillation detector may include outputting an oscillation detection signal when the second pulse signal has consecutive pulses for at least a certain time in operation S730.

The operating method of the oscillation detector may include generating the second pulse signal at a high level when the number of cycles of the first pulse signal that is counted while the reference clock signal is at a high level is greater than or equal to a certain value.

The operating method of the oscillation detector may include generating a plurality of frequency-divided signals having different frequencies by dividing the frequency of the second pulse signal and performing an AND operation on the frequency-divided signals.

Figure 8:
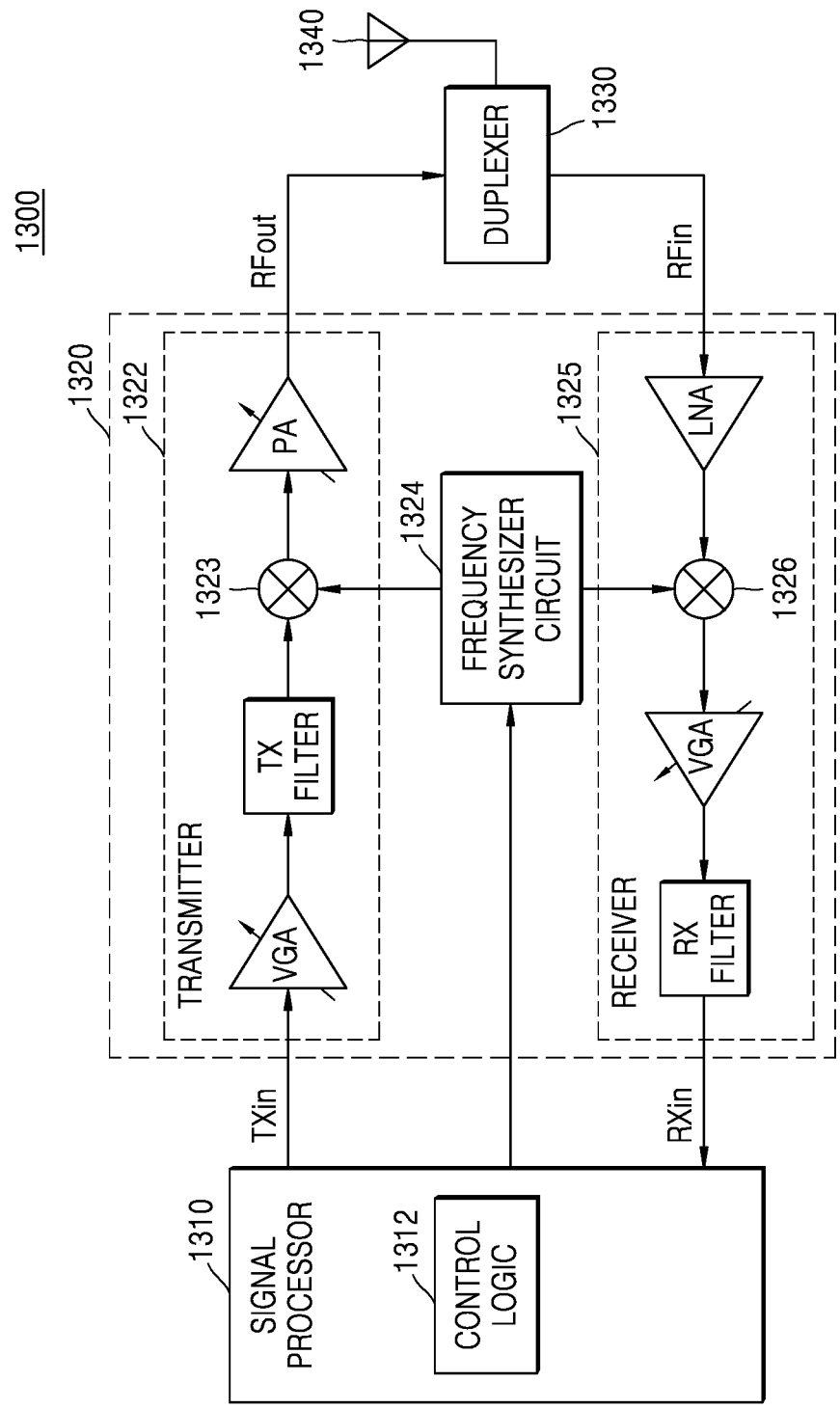
FIG. 8 is a block diagram of a wireless communication device according to an example embodiment.

FIG. 8 is a block diagram of a wireless communication device 1300 according to an example embodiment.

The wireless communication device 1300 may include an antenna 1340 and communicate with another device by transmitting or receiving a signal through the antenna 1340. As a non-limiting example, a wireless communication system, in which the wireless communication device 1300 communicates with another device, may correspond to a wireless communication system, such as a 5th generation (5G) wireless system, a long term evolution (LTE) system, an LTE advanced (LTE-A) system, a code division multiple access (CDMA) system, or a global system for mobile communication (GSM) system, using a cellular network, a wireless local area network (WLAN) system, or another random wireless communication system.

According to an example implementation, the wireless communication device 1300 may include a signal processor 1310, a transceiver 1320, and a duplexer 1330. The duplexer 1330 may provide a signal, which is received through the antenna 1340, to the transceiver 1320 as a radio frequency (RF) input signal RFin and provide an RF output signal RFout from the transceiver 1320 to the antenna 1340.

According to an example implementation, the signal processor 1310 may correspond to a baseband processor and include a control logic 1312. The signal processor 1310 may process baseband transmit (TX) and receive (RX) signals. In detail, the signal processor 1310 may generate a baseband signal for a TX signal path of the transceiver 1320 and process a baseband signal received through a RX signal path of the transceiver 1320.

The transceiver 1320 may include a transmitter 1322, a receiver 1325, and a frequency synthesizer circuit 1324.

The frequency synthesizer circuit 1324 may include or be connected to an oscillation detector according to an example embodiment. Accordingly, whether an output signal oscillates may be monitored by the oscillation detector.

The transmitter 1322 may generate the RF output signal RFout by processing a TX input signal TXin received from the signal processor 1310. To process the TX input signal TXin, the transmitter 1322 may include a variable gain amplifier VGA, a TX filter, a TX mixer 1323, and a power amplifier PA. The receiver 1325 may generate an RX input signal RXin by processing the RF input signal RFin and provide the RX input signal RXin to the signal processor 1310. To process the RF input signal RFin, the receiver 1325 may include a low-noise amplifier LNA, an RX mixer 1326, a variable gain amplifier VGA, and an RX filter. According to an embodiment, the frequency synthesizer circuit 1324 may generate a reference clock signal having a frequency for sampling the TX input signal TXin and the RF input signal RFin and provide the reference clock signal to the TX mixer 1323 and the RX mixer 1326.

Although it is illustrated in FIG. 8 that control information is provided by the signal processor 1310, embodiments are not limited thereto. For example, the control information may be internally generated by the transceiver 1320 or may be generated by a control circuit outside the transceiver 1320.

Figure 9:
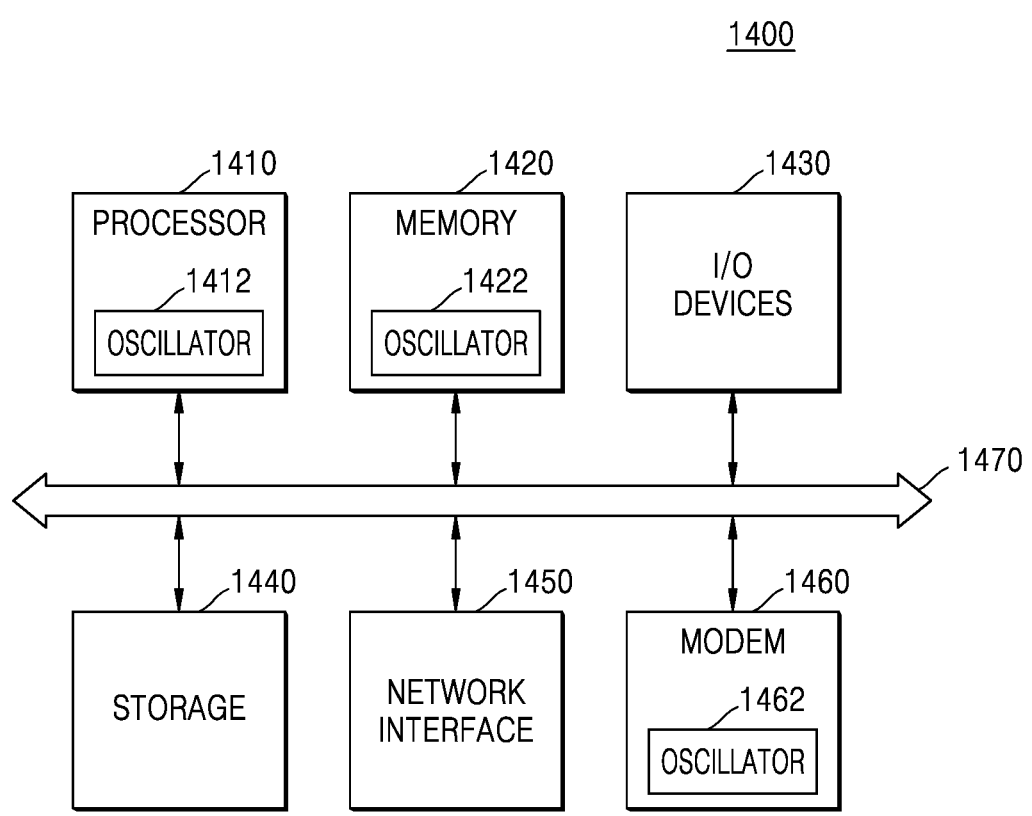
FIG. 9 is a block diagram of a computing system according to an example embodiment.

FIG. 9 is a block diagram of a computing system 1400 according to an example embodiment.

The computing system 1400 may include a stationary computing system such as a desktop computer, a workstation, or a server or a mobile computing system such as a laptop computer or a portable computer. The computing system 1400 may include a semiconductor device.

As shown in FIG. 9, the computing system 1400 may include a processor 1410 including an oscillator 1412, a memory 1420, input/output (I/O) devices 1430, a storage 1440, a network interface 1450, and a modem 1460 including an oscillator 1462. The processor 1410, the memory 1420, the I/O devices 1430, the storage 1440, the network interface 1450, and the modem 1460 may be connected to a bus 1470 and may communicate with one another through the bus 1470.

The processor 1410 may be referred to as a processing unit may include at least one core, such as a microprocessor, an application processor (AP), a digital signal processor (DSP), or a graphics processing unit (GPU), which may execute an instruction set (e.g., Intel Architecture (IA)-32, 64-bit extension IA-32, x86-64, PowerPC, Sparc, MIPS, ARM, or IA-64). For example, the processor 1410 may access the memory 1420 through the bus 2470 and execute instructions stored in random access memory (RAM) or read-only memory (ROM).

The processor 1410 may include the oscillator 1412. The oscillator 1412 may include a frequency synthesizer circuit for frequency synthesis and multiplication and clock generation, according to example embodiments. For example, the oscillator 1412 may generate a clock signal for operating the processor 1410 requiring the clock signal and change or multiply the frequency of the clock signal according to circumstances.

The oscillator 1412 may include or be connected to an oscillation detector according to an example embodiment. Accordingly, whether an output signal oscillates may be monitored by the oscillation detector.

The memory 1420 may include volatile memory (or RAM), such as dynamic RAM (DRAM), or volatile memory (or ROM), such as flash memory.

The memory 1420 may include an oscillator 1422. For example, the oscillator 1422 may generate a clock signal for operating the processor 1410 requiring the clock signal and change or multiply the frequency of the clock signal according to circumstances.

The I/O devices 1430 may include an input device, such as a keyboard or a pointing device, and an output device, such as a display or a printer. For example, a user may input a value of M and a digital trim code K_int or K_frac using the I/O devices 1430, and the I/O devices 1430 may transmit the value of M and a digital trim code K_int or K_frac to the oscillator 1412 of the processor 1410 and the oscillator 1422 of the memory 1420 through the bus 1470. The oscillator 1412 of the processor 1410 and the oscillator 1422 of the memory 1420 may adjust the frequency of the clock signal according to the value of M and a digital trim code K_int or K_frac.

The storage 1440 may store data to be processed by the processor 1410 or data that has been processed by the processor 1410. In other words, the processor 1410 may generate data by processing data stored in the storage 1440 and store the generated data in the storage 1440.

The network interface 1450 may provide access to a network outside the computing system 1400. For example, the network may include a plurality of computing systems and communication links. The communication links may include wired links, optical links, wireless links, or other types of links.

The modem 1460 may communicate with an external device via a wired or wireless connection. For example, the modem 1460 may perform Ethernet communication, near field communication (NFC), RF identification (RFDID) communication, mobile telecommunication, memory card communication, or universal serial bus (USB) communication but is not limited thereto.

The modem 1460 may include an oscillator 1462. For example, the oscillator 1462 may generate a clock signal for operating the modem 1460 requiring the clock signal and change or multiply the frequency of the clock signal according to circumstances.

According to an example implementation, the oscillators 1412, 1422, and 1462 may be formed as externally independent devices and include a clock control unit configured to control the frequency of a clock signal of the computing system 1400. Accordingly, different clock signals may be respectively provided to the processor 1410, the memory 1420, and the modem 1460, which respectively operate at different frequencies.

While the inventive concept has been particularly shown and described with reference to embodiments thereof, it will be understood that various changes in form and details may be made therein without departing from the spirit and scope of the following claims.

What is claimed is:

1. An oscillation detector for detecting oscillation of a voltage, the oscillation detector comprising:
   an amplitude variation detection circuit configured to generate a first pulse signal by comparing a level of a first voltage with a level of a second voltage;
   a frequency variation detection circuit configured to generate a second pulse signal by filtering the first pulse signal and allowing a frequency component that is less than or equal to a reference frequency from among frequency components of the first pulse signal; and
   a time variation detection circuit configured to output an oscillation detection signal based on the second pulse signal having consecutive pulses for a first time period.

2. The oscillation detector of claim 1, wherein the amplitude variation detection circuit includes:
   a low-pass filter configured to perform low-pass filtering on an external voltage to generate the first voltage;
   a plurality of resistors configured to scale the external voltage to generate the second voltage; and
   a comparator configured to generate the first pulse signal by comparing a level of the first voltage with the second voltage.

3. The oscillation detector of claim 1, wherein the frequency variation detection circuit is further configured to:
   generate the second pulse signal at a low level when a frequency of the first pulse signal is less than or equal to the reference frequency, and
   generate the second pulse signal at a high level when the frequency of the first pulse signal exceeds the reference frequency.

4. The oscillation detector of claim 3, wherein the frequency variation detection circuit is further configured to receive a reference clock signal, and
   wherein a first frequency of the second pulse signal is equal to a second frequency of the reference clock signal.

5. The oscillation detector of claim 1, wherein the frequency variation detection circuit includes a frequency counter configured to:
   receive a reference clock signal, and
   generate the second pulse signal at a high level when a number of cycles of the first pulse signal is greater than or equal to a reference value,
   wherein the number of cycles of the first pulse signal being counted while the reference clock signal is at a high level.

6. The oscillation detector of claim 1, wherein the time variation detection circuit is further configured to:
   generate a plurality of frequency-divided signals having different frequencies by dividing a frequency of the second pulse signal, and
   output the oscillation detection signal based on the plurality of frequency-divided signals.

7. The oscillation detector of claim 6, wherein the time variation detection circuit includes:
   a time counter configured to divide the frequency of the second pulse signal;
   an AND gate configured to perform an AND operation on the plurality of frequency-divided signals; and
   a memory circuit configured to generate the oscillation detection signal indicating occurrence of oscillation by maintaining a pulse of a signal generated based on the AND operation at a high level.

8. An oscillation detector for detecting oscillation of a voltage, the oscillation detector comprising:
   an amplitude variation detection circuit configured to generate a first pulse signal by comparing a level of a first voltage with a level of a second voltage;
   a frequency variation detection circuit configured to count a number of pulses of the first pulse signal in a first time period and generate a second pulse signal based on the number of pulses; and
   a time variation detection circuit configured to generate a plurality of frequency-divided signals having different frequencies by dividing a frequency of the second pulse signal and output an oscillation detection signal based on the plurality of frequency-divided signals.

9. The oscillation detector of claim 8, wherein the first voltage is obtained by scaling an external voltage input, and the second voltage corresponds to a direct current (DC) component of the external voltage input, and
   wherein the amplitude variation detection circuit is further configured to output the first pulse signal by generating a pulse signal when the first voltage is greater than the second voltage.

10. The oscillation detector of claim 8, wherein the frequency variation detection circuit is further configured to receive a reference clock signal,
    generate the second pulse signal at a low level when the number of pulses of the first pulse signal is less than a reference value while the reference clock signal is at a high level, and
    generate the second pulse signal at a high level starting from a moment when the number of pulses is at least the reference value while the reference clock signal is at the high level.

11. The oscillation detector of claim 10, wherein the frequency of the second pulse signal is equal to a frequency of the reference clock signal.

12. The oscillation detector of claim 10, wherein a first pulse width of the second pulse signal is less than or equal to a second pulse width of the reference clock signal.

13. The oscillation detector of claim 8, wherein the time variation detection circuit is further configured to generate an output signal by performing an AND operation on the plurality of frequency-divided signals and generate the oscillation detection signal indicating occurrence of oscillation when the output signal is maintained at a low level for a reference time period.

14. The oscillation detector of claim 13, wherein the time variation detection circuit is further configured to generate the oscillation detection signal at a high level starting from a moment when a pulse of the output signal occurs after a lapse of the reference time period during which the output signal is at the low level.

15. The oscillation detector of claim 8, wherein the amplitude variation detection circuit includes:
- a comparator;
- a low-pass filter between a first node and a first input terminal of the comparator, an external voltage being applied to the first node;
- a first resistor connected between the first node and a second node connected to a second input terminal of the comparator; and
- a second resistor connected between the second node and ground.

16. The oscillation detector of claim 10, wherein the time variation detection circuit is further configured to generate the plurality of frequency-divided signals by determining a plurality of division factors based on a frequency of the reference clock signal.

17. An oscillation detector comprising:
- a receiver configured to receive an external voltage; and
- a processor configured to:
    - generate a first voltage by performing low-pass filtering on the external voltage;
    - generate a second voltage by scaling the external voltage;
    - generate a first signal by comparing the first voltage with the second voltage;
    - generate a second signal by filtering the first signal to pass a frequency component that satisfies a first criteria; and
    - output an oscillation detection signal based on the second signal satisfying a second criteria.

18. The oscillation detector of claim 17, wherein the second signal satisfies the second criteria when the second signal has consecutive pulses for a first time period.

19. The oscillation detector of claim 17, wherein the processor is further configured to generate the second signal when a number of cycles of the first signal is greater than or equal to a reference value.

20. The oscillation detector of claim 17, wherein the processor is further configured to generate the second signal by filtering the first signal to pass the frequency component that satisfies the first criteria by: generating the second signal at a low level when the frequency component of the first signal is less than or equal to a reference frequency, and generating the second signal at a high level when the frequency component of the first signal greater than the reference frequency.

* * * * *